United States Patent [19]
Yamagata et al.

[11] Patent Number: 5,143,750
[45] Date of Patent: Sep. 1, 1992

[54] METHOD OF MANUFACTURING CHEMICALLY ADSORBED FILM

[75] Inventors: Yoshikazu Yamagata, Moriguchi; Norihisa Mino, Settu; Kazufumi Ogawa, Hirakata; Mamoru Soga, Osaka, all of Japan

[73] Assignee: Matsushita Electric Industrial Co., Ltd., Kadoma, Japan

[21] Appl. No.: 810,114

[22] Filed: Dec. 19, 1991

[30] Foreign Application Priority Data

Dec. 21, 1990 [JP] Japan .................. 2-404860

[51] Int. Cl.⁵ .............................. B05D 3/12
[52] U.S. Cl. .................. 427/57; 427/44; 427/302; 427/322; 427/327; 427/352; 427/436; 427/443.2
[58] Field of Search ............ 427/44, 57, 302, 322, 427/327, 352, 436, 443.2

[56] References Cited

U.S. PATENT DOCUMENTS 4,539,061 9/1985 Segiv ........................ 156/278
4,863,794 9/1989 Fujii ........................ 428/325

FOREIGN PATENT DOCUMENTS 0363924 10/1989 European Pat. Off. .
0386784 3/1990 European Pat. Off. .

OTHER PUBLICATIONS

World Patents Index Latest, Derwent Publications Ltd., London, GB; AN 86–065417 & JP-A-61 016 910 (Hitachi Cable KK), Jan. 24, 1986 (abstract).

*Primary Examiner*—Bernard Pianalto
*Attorney, Agent, or Firm*—Fish & Richardson

[57] ABSTRACT

According to the invention, a chemically adsorbing material is reacted with a substrate surface having active hydrogen groups by dipping the substrate into a solution of the chemically adsorbing material simultaneous and applying ultrasonic waves to the solution. In this way, a high concentration monomolecular and/or polymer film substantially free from pin holes can be formed in a short period of time. That is, while the ultrasonic waves are applied, a chemical adsorbing material having an end functional chlorosilyl group is adsorbed onto the substrate surface, thereby forming a chemically adsorbed monomolecular and/or polymer film. The frequency of the ultrasonic waves are suitably in a range of 25 to 50 kHz. In addition, after formation of the adsorbed film, the substrate is washed for making monomolecular film by dipping it in a washing solution while applying ultrasonic waves. In this way, non-reacted chemical adsorbing material remaining on the substrate can be efficiently washed away.

15 Claims, 4 Drawing Sheets

METHOD OF MANUFACTURING CHEMICALLY ADSORBED FILM

FIELD OF THE INVENTION

This invention relates to a method of manufacturing a chemically adsorbed film. More particularly, the invention relates to a method of efficiently forming a chemically adsorbed monomolecular and/or polymer film as a surface film. The method can be used in the fields of glass, metal, ceramic, plastic, semiconductor, etc., manufacturing.

BACKGROUND OF THE INVENTION

In the fields of glass, metal, ceramic, plastic, semiconductor, etc., maunufacturing, water-repelling, oil-repelling, anti-fogging, anti-contaminating, durability and various other properties are imparted to manufactured substrates by applying a coating film on the substrate surface. By imparting these properties, the value of the manufactured products can be enhanced.

Among well-known methods of providing a coating film on the substrate surface are dipping, spraying, brushing, spin coating, and printing techniques such as the planographic process, relief printing and screen printing. In these techniques, however, the coating solution is merely put physically on the substrate surface, and the adhesion between the substrate surface and coating film is not sufficiently high. Coating film should have a specific thickness. However, it has been difficult using known method to form a coating film having a thickness at the nanometer level which is uniform and free from pin holes.

The inventors have proposed a method for forming an adsorbed film by using a chemical adsorption process. In this method a substrate having hydrophilic groups at the surface is dipped and held in an organic solution containing end functional molecular groups capable of reacting with the hydorphilic groups (hereinafter referred to as a chemical adsorbing material). The adsorbing reaction is brought about at constant temperature in a still or agitated state. Without being bound by the theory, it is believed that the reaction between the hydrophilic groups on the substrate surface and the chemical adsorbing material is brought about very quickly which results in the formation of an adsorbed film.

A previously proposed method of manufacturing a chemically adsorbed film was found to be problematic. That is, where the reactivity between the chemical adsorbing material and the hydrophilic groups on the substrate surface was low, or where highly bulky functional groups or side chains were present in the chemical adsorbing material, the material became space on the substrate due to decreasing reactivity effects or three-dimensional interferences. Thus a long time was required for forming a highly dense chemically adsorbed film. In addition, it decreased the concentration of the chemically adsorbed film, that the saturated adsorption of the chemical adsorbing material to the substrate surface was reduced.

Moreover, even if the reactivity between the chemical adsorbing material and the hydrophilic groups contained in the substrate surface was high, the rate of adsorption was extremely reduced in the last stage of the adsorption. This was due to the seeming reduction of the hydrophilic groups such as hydroxyl groups (commonly termed adsorption sites) on the substrate by the interference between the non-reacted hydrophilic groups and the chemical adsorbing material which behavior and as a barrier formed during the adsorption process.

The present invention, therefore, improves the method of manufacturing the chemically adsorbed film previously proposed by providing a highly concentrated chemically adsorbed film in short period of time.

SUMMARY OF THE INVENTION

The primary objective of this invention is to provide a method of forming a chemically adsorbed monomolecular film on the surface of a substrate, wherein the surface contains active hydrogen groups, the method comprising:

(A) preparing a chemical adsorbing material solution by dissolving a chemical adsorbing material in a non-aqueous organic solvent, the chemical adsorbing material having end functional molecular groups capable of reacting with the active hydrogen groups on the substrate surface;

(B) dipping the substrate in the chemical adsorbing material solution and applying ultrasonic waves, thereby causing adsorption of the chemical adsorbing material to the substrate surface; and (C) washing non-reacted chemical adsorbing material away from the substrate surface using a non-aqueous organic solution.

It is preferable in this invention that ultrasonic waves are applied to the organic solution in the step of washing away the non-reacted chemically adsorbing material (i.e., step C).

Another objective of this invention is to provide a method of forming a chemically adsorbed polymer film on the surface of a substrate, wherein the surface of the substrate contains active hydrogen groups, the method comprising:

(a) preparing a chemical adsorbing material solution by dissolving a chemical adsorbing material in a non-aqueous organic solvent, the chemical adsorbing material having end functional molecular groups capable of reacting with the active hydrogen groups on the substrate surface;

(b) dipping the substrate in the chemical adsorbing material solution and applying ultrasonic waves, thereby causing adsorption of the chemical adsorbing material to the substrate surface;

(c) forming on the substrate adsorbed precursor film constituted by a compound containing a silanol group by reacting the chlorosilane groups with water after the dipping step; and (d) drying the adsorbed precursor film.

It is preferable in this invention that the frequency of the ultrasonic waves are in a range of 1 to 1,000 kHz.

It is preferable in this invention that the molecular ends of the chemical adsorbing material comprising at least one member selected from a group consisting of a halogenated silyl (—SiX) group, a halogenated titanyl (—TiX) group, a halogenated stannyl (—SnX) group, a lower-alkoxysilyl (—SiOR) group, a lower-alkoxytitanyl (—TiOR) group and a lower-alkoxytitanyl (—SnOR) group, where X represents chlorine, bromine, fluorine or iodine and R represents a $C_1$–$C_6$ alkyl group.

It is preferable in this invention that the chemical adsorbing material comprises an end functional chlorosilyl (—SiCl) group and a fluorine group.

It is preferable in this invention that the concentration of the chemical adsorbing material in the non-aqueous organic solvent is in a range of $10^{-4}$ to $10^{-1}$ mol/l.

It is preferable in this invention that the substrate comprises material selected from the group consisting of glass, metal, ceramic, plastic and semiconductor etc.

It is preferable in this invention that the substrate is an oxidation treated plastic substrate.

According to the invention, a highly concentrated chemically adsorbed monomoleclar and/or polymer film can be formed more efficiently on the substrate surface. This is achieved by a step B among steps A to C which increases the probability of reaction of a chemical adsorbing material having active hydrogen groups, such as hydroxyl groups or imino groups, on the substrate surface by using ultrasonic waves. In addition, the probability of reaction of any non-adsorbed active hydrogen groups remaining on the substrate can be increased by giving vibrations to the already preferentially adsorbed single molecules. According to the invention, by using a chemical adsorption method, a hydrophobic film with a very thickness of the nanometer level and uniformity can be formed on the surface of a substrate without spoiling gloss and transparency thereof. Thus, it is posible to provide a substrate, which is highly hydrophobic, oil-phobic, substantially pin hole free, heat resistant property, durability property and contamination free. In the subsequent step C, the unreated chemical adsorbing material is washed away using a non-aqueous organic solution. Thus, a monomolecular film having a uniform thickness can be obtained in a short time.

Further, in a preferred mode of the invention, ultrasonic waves are applied to the organic solvent in the step C as well, such that non-reacted chemical adsorbing material can be efficiently washed away.

Further, if the frequency of the ultrasonic waves are in a range of 1 to 1,000 kHz, preferably in a range of 25 to 50 kHz, in the step B, the chemical adsorbing material may be efficiently brought into contact with the substrate surface for reaction. This also applies to step C wherein chemical adsorbing material may be efficiently washed away.

According to the second invention step (a) to (d), a cemically adsorbed polymer film is formed onto the substrate.

The chemical adsorbing material may be suitably used, in which one molecular end comprises at least one member selected from the group consisting of halogenated silyl group (—SiX), a halogenated titanyl group (—TiX), a halogenated stannyl group (—SnX), a lower-alkoxysilyl group (—SiOR) and a lower-alkoxystannyl (—TiOR) group, where X represents Cl, Br, F or I and R represents a $C_1-C_6$ alkyl group. For imparting water-repelling, oil-repelling, anti-fogging, anti-contaminating, durability and various other properties, the chemical adsorbing material to be used is suitably a compound having at one molecular end a chlorosilyl group (—SiCl) and at another molecular in a fluorine group. Further, by providing a conjugate unsaturated bond to one end of the chemical adsorbing material molecule for polymerizing the chemically adsorbed single molecules to form conjugate unsaturated bonds, it is possible to form a monomolecular film of this nature has various functions such as in electric conductivity.

According to the invention, the concentration of the chemical adsorbing material in the non-aqueous organic solvent is suitably in a range of $10^{-4}$ to $10^{-1}$ mol/l. In this range of concentration, a monomolecular and/or polymer film can be formed efficiently.

According to the invention, the substrate may be of any material. However, the material is suitably selected from glass, metal, ceramic, plastic and semiconductor etc. Likewise, according to the invention it is suitable to use plastic substrates, the surface of which has been oxidation treated.

DETAILED DESCRIPTION OF THE INVENTION

Figure 1:
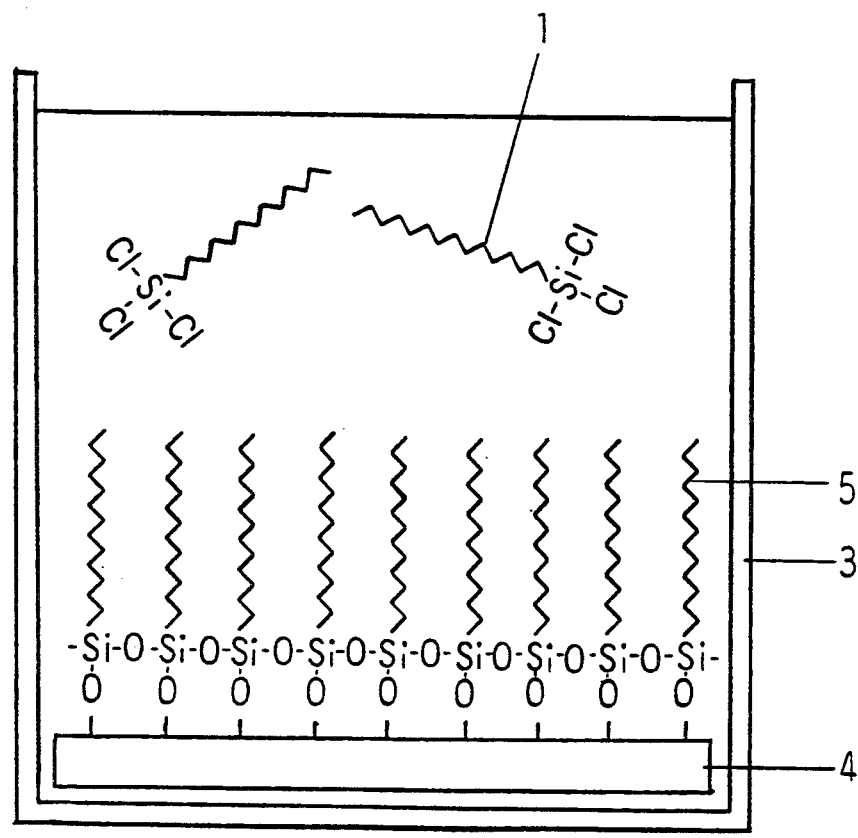
FIG. 1 is a schematic view showing the end of an adsorption step in one embodiment of the invention.

The principle of manufacture of the chemically adsorbed film according to the invention resides in the formation of a monomolecular and/or polymer film by utilizing the reaction between an active hydrogen group such as a hydroxyl group (—OH), an amino group (—$NH_2$), an imino group (=NH), on the substrate surface, and a functional group, such as a chlorosilyl group, at one end of the molecule to be adsorbed. The rate of formation of the adsorbed film and the saturated adsorption of the film molecules are greatly affected by the concentration of the adsorbed material, the temperature at the adsorption, the speed of reaction between the substrate surface and the adsorption molecules, the shape of the adsorption molecules, the number of hydroxyl groups on the substrate surface, the state of the substrate surface and so forth.

Since the chemically adsorbed film according to the invention utilizes molecules having functional groups capable of reacting with active hydrogen groups, the atmosphere of the adsorption film formation step is as low in relative humidity as possible. Desirably, the humidity is at a perfectly dry state.

The frequency of the ultrasonic waves to be used according to the invention is a frequency capable of causing cavitation. A frequency range of 25 to 50 kHz using commercially available ultrasonic washers may be used. The form of the ultrasonic waves source is by no means limited so long as ultrasonic waves can be applied imparted to a solution which contains a chemical adsorbing material, and into which a substrate is dipped and held.

The substrate according to the invention is by no means limited so long as its surface contains active hydrogen groups such as —OH, —COOH, —$NH_2$ or =NH groups. Examples of the substrate material are various kinds of glass such as quartz glass, fluoride glass and metal glass, metals such as aluminum, iron, stainless steel, titanium, semiconductors such as silicon and germanium, and plastics such as polypropylene, polystyrene, polyethylene and acryl resin. Substrates with less surface hydrophilic groups, for instance plastic substrates, may be made suitable according to the invention by increasing the hydrophilic groups through ordinary chemical treatment means such as oxidation of ozone electron beam irradiation. Polyimide resins and polyurethane resins have surface imino groups (=NH) and therefore do not require any pre-treatment.

Alternative pre-treatment means effective for the surface of substrates such as glass, metals, ceramics and plastics, silica ($SiO_2$), is for example deposited or polyhalogenated silane such as dichlorosilane, trichlorosilane and tetrachlorosilane is coated and reacted with water. The pre-treatment can be with or without washing with a non-aqueous solution and increases the formation of silanol (—SiOH) groups on the substrate surface. By so doing, the chemical adsorbing material can be reacted in a high concentration.

According to the invention, any organic solvent may be used so long as it is a non-aqueous organic solvent, does not attack the substrate and permits sufficient dissolution of the chemical adsorbing material, since the chemical adsorbing material is reacted with hydrous molecules. Examples of the organic solvent are long chain alkyl-based solvents, aromatic hydrocarbon-based solvents, aliphatic hydrocarbon-based solvents and halogen-containing solvents.

The concentration of the chemical adsorbing material solution is varied depending on the concentration of hydrophilic groups present on the substrate surface or the surface area of the substrate. If the concentration is insufficient, the adsorption speed is low. Thus an utility lacks for an industrial standpoint, although it is acceptible at the experimental level. On the other hand, if the concentration is excessive, the number of molecules preferentially chemically adsorbed onto the hydrophilic groups at the substrate surface and the adsorption speed are not effected. In addition, the already preferentially adsorbed monomolecular film is sort of dodged through by molecules that are adsorbed to non-adsorbed hydrophilic groups remaining on the substrate surface in the final stage of adsorption. Because of this dodging, the time until reaching a high concentration adsorbed state is not significantly effected. Therefore, it is preferred that the concentration of chemical adsorbing material solution is about $10^{-4}$ mol/l or above, more preferably $10^{-3}$ mol/l or above. The most preferred upper limit is $10^{-1}$ mol/l.

To form only a single chemically adsorbed monomolecular film (not polymer film) according to the invention, it is necessary to carry out after the monomolecular film formation step a washing step, in which nonreacted molecules remaining on the monomolecular film are washed away without water. In this washing step the washing efficiency can be extremely increased by using ultrasonic waves. As a method of washing, ultrasonic waves are applied by transferring the substrate to a washing solution, or while causing over-flow of the washing solution, or by renewing the washing solution several times.

Examples of the chemical adsorbing material to be used suitably according to the invention are such as followes;
$CF_3(CH_2)_2Si(CH_3)_2(CH_2)_{15}SiCl_3$,
$F(CF_2)_4(CH_2)_2Si(CH_3)_2(CH_2)_9SiCl_3$,
$CF_3CH_2O(CH_2)_{15}SiCl_3$,
$CF_3COO(CH_2)_{15}SiCl_3$,
$CF_3(CF_2)_9(CH_2)_2SiCl_3$,
$CF_3(CF_2)_7(CH_2)_2SiCl_3$,
$CF_3(CF_2)_5(CF_2)_2SiCl_3$,
$CF_3(CF_2)_7(CF_2)_2SiCl_3$, and
$CF_3CH_2O(CH_2)_{15}SiCl_3$ etc.

As has been shown, according to the invention ultrasonic waves are used in the monomolecular and/or polymer film formation step. Thus, the adsorption time for the formation of the adsorbed film can be greatly reduced compared to known methods. This is effective for industrial mass production as well. Further, with the method according to the invention, the chemical adsorbing material can be adsorbed at a high concentration compared to the known chemically adsorbed films. Thus, it is possible to form a film substantially free from pin holes (substantially pin hole free) and obtain more stabilized and improved physical and chemical properties of the film. Further, it is possible to improve the orientation of the adsorbed molecules.

According to the invention, a chemically adsorbing material is reacted with a substrate surface having active hydrogen groups by dipping the substrate into a solution of the chemically adsorbing material simultaneous and applying ultrasonic waves to the solution. In this way, a high concentration monomolecular and/or polymer film substantially free from pin holes can be formed in a short period of time. That is, while the ultrasonic waves are applied, a chemical adsorbing material having an end functional chlorosilyl group is adsorbed onto the substrate surface, thereby forming a chemically adsorbed monomolecular and/or polymer film. The frequency of the ultrasonic waves are suitably in a range of 25 to 50 kHz. In addition, after formation of the adsorbed film, the substrate is washed for making monomolecular film by dipping it in a washing solution while applying ultrasonic waves. In this way, non-reacted chemical adsorbing material remaining on the substrate can be efficiently washed away.

The invention is applicable to various fields.

The invention can be widely applied to the following material surface. Materials made of metals, cermics or plastics, woods and stones etc. are applicable to the substrate. The surface of the substrate can also be coated with paints or the like.

Examples of cutlery: a kitchen knife, scissors, a knife, a cutter, a graner, a razor, hair clippers, a saw, a plane, a chisel, a gimlet, a badkin, a bite (cutting tools), the edge of a drill, the edge of a mixer and juicer, a blade of a mill, a blade of a lawnmower, a punch, a straw cutter, a staple of a stapler, a can opener or a surgical knife and the like.

Examples of needles: an acupuncture needle, a sewing needle, a matting needle, an injection needle, a surgical needle, a safety pin and the like.

Examples of products in the pottery industry: products made of a pottery, a glass, ceramics or enameled products. For example, such as sanitary pottery (a chamber pot, a washbowl, a bathtub etc.), tableware (a rice-bowl teacup, a dish (plate), a bowl, a teacup, a glass, a bottle, a coffee-pot (siphon), a pan, an earthenware mortar, a cup and (the like), vases (a flower bowl, a flowerpot, a bud vase and the like), water tanks (a breeding cistern, an aquarium water tank and the like), chemical experiment appliances (a beaker, a reactor vessel, a test tube, a flask, a laboratory dish, condenser, a mixing rod, stirrer, a mortar, a bat, a syringe etc.) a roof tile, enameled ware, an enameled washbowl, and an enameled pan and the like.

Examples of mirrors: a hand mirror, a full-length mirror, a bathroom mirror, a lavatory mirror, vehicle mirrors (a rear-view mirror, a side mirror, a door mirror etc.), half mirror, road mirrors such as a curve mirror, a show window glass, a salesroom in the department store, medical care mirrors, a concave mirror, a convex mirror and the like.

Examples of molding parts: dies for press molding, dies for cast molding, dies for injection molding, dies for transfer molding, dies for compression molding, dies for transfer molding, dies for inflation molding, dies for vacuum molding, dies for blow forming, dies for extrusion molding, dies for fiber spinning, a calender processing roll and the like.

Examples of ornaments: a watch, a jewel, a pearl, a sapphire, a ruby, an emerald, a garnet, a cat's eye, a diamond, a topaz, a bloodstone, an aquamarine, a turquoise, an agate, a marble, an amethyst, a cameo, an opal, a crystal, a glass, a ring, a bracelet, a brooch, a tiepin (a stickpin), an earring, a necklace, jewelry made of platinum, gold, silver, copper, aluminum, titanium, tin and those alloy, stainless steel, a glass frame and the like.

Examples of forming molds for food: cake, cookies, bread-baking, chocolate, jelly, ice cream, ovenware, ice trays and the like.

Examples of cookware: kitchen utensils (a pan and a pot), a kettle, a pot, a frying-pan, a hot plate, a toasting net, a takoyaki plate and the like.

Examples of papers: photogravure paper, hydrophobic and oilphobic paper, poster paper, high-grade pamphlet paper, wrapping paper, package paper, drinking package paper, container paper, printing paper, synthetic insulating paper and the like.

Examples of resin(s): a polyolefin such as a polypropylene and polyethylene, a polyvinylchloride plastic, a polyamide, a polyimide, a polyamideimide, a polyester, an aromatic polyester, a polycarbonate, a polystyrene, a polysulfide, a polysulfone, a polyethersulfone, a polyphenylenesulfide, a phenolic resin, a furan resin, a urea resin, an epoxy resin, a polyurethane, a silicon resin, an ABS resin, a methacrylic resin, an acrylate resin, a polyacetal, a polyphenylene oxide, a poly methylpentene, a melamine resin, an alkyd resin, an unsaturated polyester cured resin and the like.

Examples of rubber: styrene-butadiene rubber, butyl rubber, nitril rubber, chloroprene rubber, polyurethane rubber, silicon rubber and the like.

Examples of household electrical appliances: a television, a radio, a tape recorder, an audio, a compact disc (CD), a refrigerator of freezing machines, a freezer, an air conditioner, a juicer, a mixer, a blade of an electric fan, a lighting apparatus, a dial plate, a dryer for perms and the like.

Examples of sports articles: skis, fishing rods, poles for pole vaulting, boats, yachts, surfboards, golf balls, bowling balls, fishing line, fishing nets, floats and the like.

The examples applying to vehicle parts:
(1) ABS resin: a lamp cover, an instrument panel, trimming parts, a protector for a motorcycle.
(2) Cellulose plastic: a car mark, a steering wheel
(3) FRP (fiber reinforced plastics): a bumper, an engine cover (jacket)
(4) Phenolic resin: a brake
(5) Polyacetal: wiper gear, a gas valve
(6) Polyamide: a radiator fan
(7) Polyarylate (polycondensation polymerization by bisphenol A and pseudo phtalic acid): a directional indicator lamp or lens, a cowl board lens, a relay case
(8) Polybutylene terephthlate (PBT): a rear end, a front fender
(9) Poly(amino-bismaleimide): engine parts, a gear box, a wheel, a suspension drive system
(10) Methacrylate resin: a lamp cover lens, a meter panel and its cover, center mark
(11) Polypropylene: a bumper
(12) Polyphenylene oxide: a radiator grill, a wheel cap
(13) polyurethane: a bumper, a fender, an instrument panel, a fan
(14) Unsaturated polyester resin: a body, a fuel, tank, a heater housing, a meter pannel.

Examples of office supplies: a fountain pen, a ball-point pen, a propelling pencil (an automatic or a mechanical pencil), a pencil case, a binder, a desk, a chair, a bookshelf, a rack, a telephone stand table, a rule (measure), a drawing instrument and the like.

Examples of building materials: materials for a roof, an outer wall and interiors. Roof materials such as a brick, a slate and a tin (a galvanized iron sheet) and the like. Outer wall materials such as wood (including a processed manufactured wood), mortar, concrete, ceramics sizing, a metalic sizing, a brick, a stone, plastics and a metal like aluminium. Interior materials such as a wood (including a processed one), a metal like aluminium, plastics, paper, fiber and the like.

Examples of building stones: granite, marble and others used for such as a building, a building material, an architectured fixture, an ornament, a bath, a grave, a monument, a gatepost, a stone wall, a paving stone and the like.

Examples of musical instruments and sound apparatus: a percussion instrument, a stringed instrument, a keyboard instrument, a woodwind instrument, brass and others, and sound apparatus such as a microphone and a speaker. To be specific, there are musical instruments such as a drum, a cymbal, a violin, a cello, a guitar, a koto (harp), a piano, a flute, a clarinet, a bamboo flute and a horn, and sound apparatus such as a microphone, a speaker and an ear-phone and the like.

Examples of a thermos bottle, a vacuum bottle, a vacuum vessel and the like.

Examples of a highly resisiting voltage insulator such as a power supplying insulator or a spark plug, which are highly hydrophobic, oilphobic and aid in preventing contamination.

The invention will now be described in greater detail in conjunction with specific examples.

EXAMPLE 1

The method of manufacturing a monomolecular film according to the invention will now be described step by step with reference to FIGS. 1 to 3.

Figure 2:
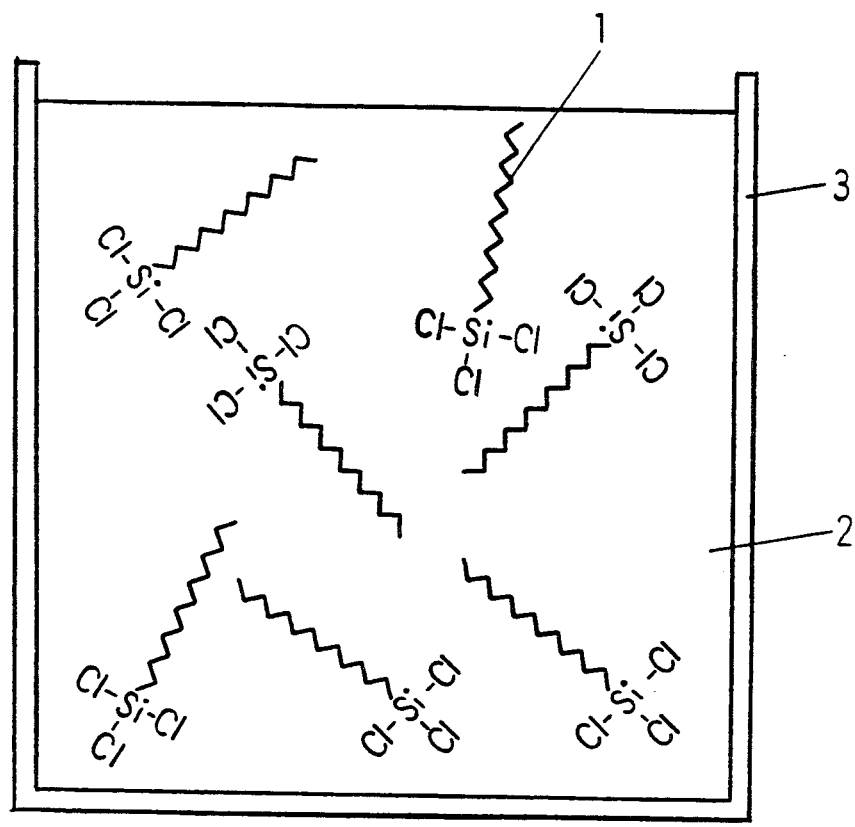
FIG. 2 is a schematic view showing an adsorption solution in one embodiment of the invention.

As shown in FIG. 2, a chemical absorbing material 1 and a non-aqueous organic solvent 2 were put into a commercially available ultrasonic washer 3 in dry air, and the chemical adsorbing material 1 was sufficiently dispersed in the organic solvent 2. The organic solvent 2 used here was a blend solvent (non-aqueous solvent) composed of 80 wt. % of normal hexadecane, 12 wt. % of chloroform and 8 wt. % of carbon tetrachloride. The chemical adsorbing material used was nonadecyltrichloro-silane $[CH_3(CH_2)_{18}SiCl_3]$, which was dissolved to a concentration of 10 mmol/l.

Figure 3:
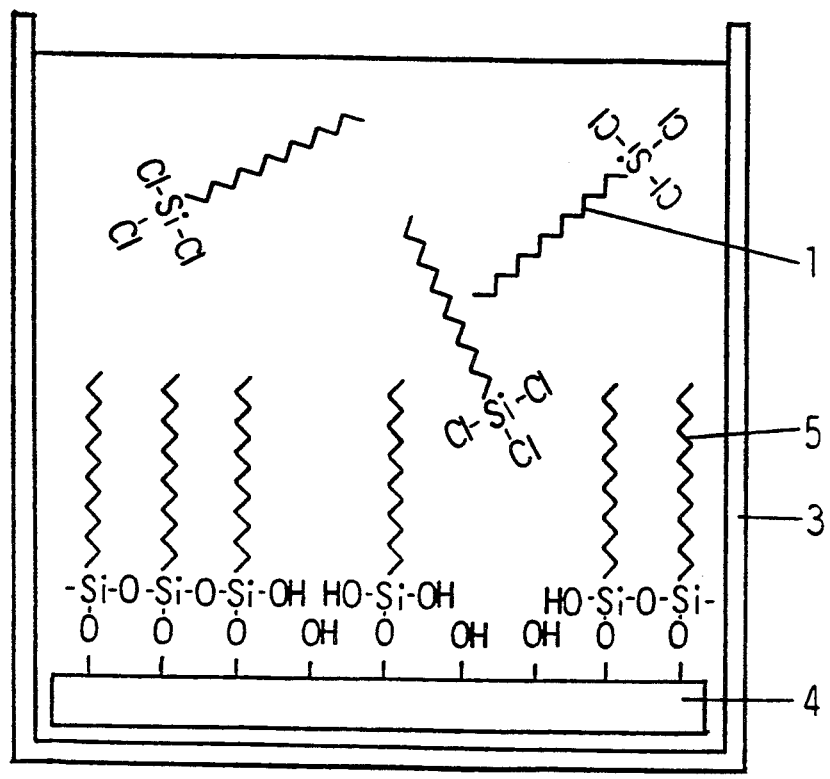
FIG. 3 is a schematic view showing an adsorption step in one embodiment of the invention.

Then, as shown in FIG. 3, by holding the solution at a temperature of 30° C., a glass substrate 4 was dipped in the solution. Simultaneously with the dipping, an ultrasonic wave was applied. The frequency of the ultrasonic waves were set to 45 kHz, and the high frequency output was set to 60 W. The glass substrate 4 had sufficient hydroxyl groups exposed on the surface. It was estimated that monomolecular adsorbed molecules 5 were present on the substrate 4, as shown in FIG. 3, as a result of preferential adsorption of the chemical adsorbing material 1 to hydroxyl groups on the substrate 4. The preferentially adsorbed monomolecular adsorbed molecules 5 formed a barrier which effected the reaction of the non-reacted chemical adsorbing material 1 and the hydroxyl groups on the substrate, thus requiring a lengthy time to form a highly concentrated chemically adsorbed monomolecular film. In the method of manufacture according to the invention, an ultrasonic wave was applied as shown in FIG. 3. Vibrations were applied to the preferentially adsorbed monomolecular adsorbed molecules 5, thus facilitating the adsorption to the hydroxyl groups on the substrate. The speed of dispersion of the non-adsorbed chemical adsorbing material 1 was improved to promote the rate of increase of the density of the chemically adsorbed monomolecular film.

In this way, a hydrochloric acid removal reaction proceeded between the hydroxyl groups on the substrate surface and the chemical adsorbing material 1. Eventually, all of the hydroxyl groups on the substrate 4 was reacted end to form the monomolecular film. A highly dense chemically adsorbed monomolecular film was found to be formed in a short period of time.

The chlorosilyl (—SiCl) groups of the fluorine-containing chlorosilane-based chemical adsorbing material and the hydroxy (—OH) groups present on the surface of the glass substrate 4, reacted by a dehydrochlorination reaction to form covalent bonds as shown by the formula 1.

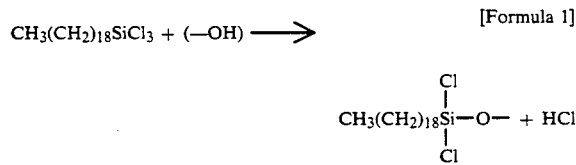

[Formula 1]

By providing water to the surface of the treated glass substrate or by contacting the surface to humidifide air, chemical bonds were formed bonds as shown by the formula 2.

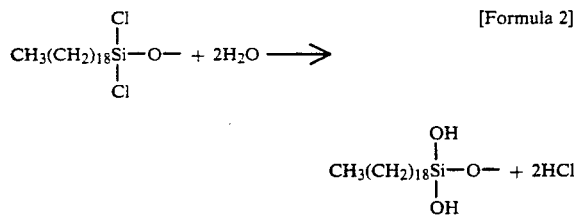

[Formula 2]

Silanol (—SiOH) groups were reacted by dehydration condensation with adjacent silanol (—SiOH) groups to form bonds as shown by the formula 3.

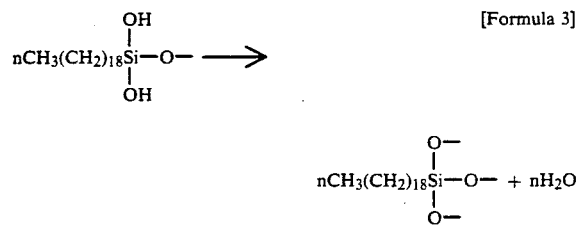

[Formula 3]

The chemically adsorbed monomolecular film had a thickness of about 2.1 nanometers. The wetting angle of its surface with respect to water was measured and formed to be about 120 degrees. The monomolecular film had excellent water-repelling, oil-repelling, anti-fogging, anti-contaminating, and durability properties.

For the sake of comparison, a chemically adsorbed monomolecular film was formed in the same manner as in the above Example 1 except that ultrasonic wave treatment was not carried out and the glass substrate was held still in the non-aqueous solvent.

Figure 4:
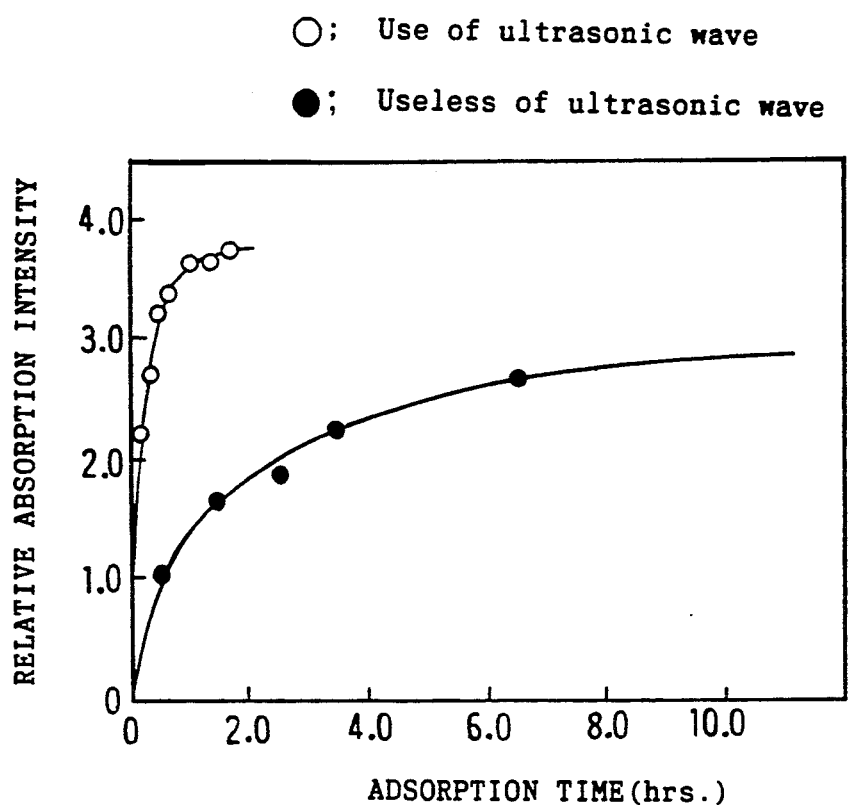
FIG. 4 is a view showing the relation between the adsorption time and the amount of adsorption in one embodiment of the invention.

The ratio of adsorption of the adsorbed molecules of the two different chemically adsorbed monomolecular films obtained above to the substrate was evaluated with FTIR. FIG. 4 shows the relation between the time required for the adsorption and the amount of adsorption. The symmetric stretching vibrations of methylene groups (—CH$_2$—) and the peak area of the converse symmetric stretching vibrations were calculated from the results of infrared absorption spectral analysis and shown as relative absorption intensities. As shown in FIG. 4, it was confirmed that where the ultrasonic waves were used (shown by the white circle) the adsorption time was about the 1/10 time or less than that of the no use of ultrasonic waves shown by the black circle. That is, the adsorption speed using ultrasonic waves was 10 times or greater. In addition, the difference between the two was the greater at the nearer saturated adsorption region. With the method according to the invention, the adsorption density at the saturation itself was increased to about 1.2 times. This indicate, that the film density was increased.

To improve the obtained monomolecular film, the substrate was dipped into chloroform or freon 113 for washing in dry air, and then washed according to the two different methods above, i.e., one using ultrasonic waves and the other without using those. By using the ultrasonic waves, sufficient washing could be realized in 5 minutes, which was about 1/6 of the washing time without using the ultrasonic waves. Thus the washing speed was improved by six times or more.

At this time, the frequency of the ultrasonic waves were applied 45 kHz, and the high frequency output was set to 60 W.

In this time, if above washing the substrate using a non-aqueous organic solution process is omited, and treatment reacting with water and drying in the air. Then, it was formed a adsorbed polymer film onto the substrate. The adsorption polymer film with satisfactory close contact with respect to the substrate, substantially pin-hole free, thinly, an anti-contaminating and a transparency.

EXAMPLE 2

Instead of nonadecyltrichloro-silane to octadecyltrichlorotin as the chemical adsorbed material, and the substrate replaced from the glass to an aluminum was used, under the same conditions as in Example 1. Like Example 1, the monomolecular film formation step with and without the use of ultrasonic waves were compared. By using the ultrasonic waves, saturation time decreased to about 1/5.

In the above examples, the frequency of the ultrasonic wave was set to 45 kHz, and the high frequency output was set to 60 W. However, these ultrasonic waves conditions are by no means limiting in obtaining the effects of the invention. By using ultrasonic waves with commercially available ultrasonic washers, the adsorption time or washing time, although there were some variations of the effects, could be greatly reduced, and the adsorption density could be improved. Further, it was estimated that the same effects by using ultrasonic waves greater than that above unless the conditions are so violent that the substrate would crack. It is also expected that even if ultrasonic waves conditions less than that noted above, it would be effective so long as vibrations are imparted to the molecules.

In this time, if above washing the substrate steps using a non-aqueous organic solution is omited, and treatment washing with water and drying in the air. Then, it was formed a adosorbed polymer film onto the substrate. The adsorption polymer film with satisfactory close contacts with respect to the substrate, substantially pin-hole free, thinly, an anti-contaminating and a transparency.

EXAMPLE 3

The chemical adsorbing material; $CF_3(CF_2)_7(CH_2)_2SiCl_3$ was dissolved to a concentration of $1 \times 10^{-2}M$ in freon-113 (an organic non-aqueous solution). Into the chemical adsorbing material solution, a substrate consisting of a nylon-6 resin molding was dipped. Ultrasonic waves were applied to the solution. The frequency of the ultrasonic wave was set to 45 kHz, and the high frequency output was set to 60 W.

The chlorosilyl (—SiCl) groups of the fluorine-containing chlorosilane-based chemical adsorbing material and the imino (=NH) groups present on the surface were reacted by a dehydrochlorination reaction to form covalent bonds as shown by the formula 4.

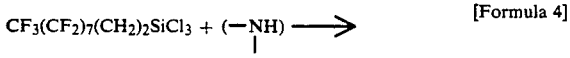

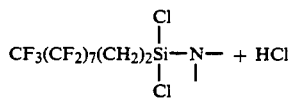

Non-reacted chemical adsorbing material attached to the surface of the nylon-6 resin molding was washed away using freon-113 under ultrasonic waves being applied. The frequency of the ultrasonic wave was 45 kHz, and the high frequency output was set to 60 W. By providing water to the surface of the treated nylon-6 resin molding or by contacting the surface with humidified in air, those chemical bonds were formed as shown by the formula 5.

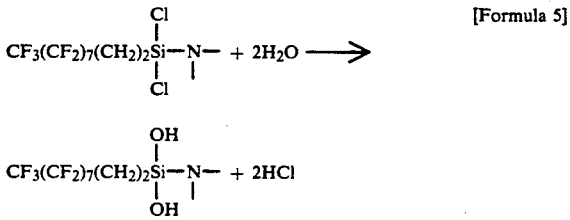

Then, silanol (—SiOH) groups underwent a dehydration condensation with adjacent silanol (—SiOH) groups to form bonds as shown by the formula 6.

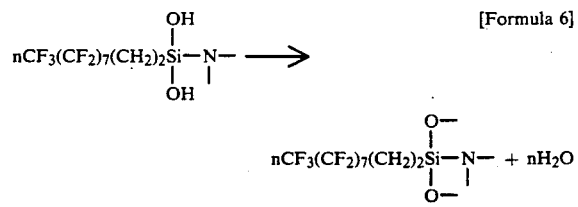

The chemically adsorbed monomolecular film had a thickness of about 2.1 nanometers. The wetting angle of its surface with respect to water was measured and formed to be about 120 degrees. The monomolecular film had excellent water-repelling, oil-repelling, anti-fogging, anti-contaminating, and durability properties.

In this time, if above washing the substrate steps using a non-aqueos organic solution (freon 113) is omitted, and treated washing with water and drying in the air. Then, it was formed a fluorine-based adosorbed polymer film onto the substrate. The fluorocarbon-based polymer film with satisfactory close contacts with respect to the substrate, substantially pin-hole free, thinly, an anti-contaminating and a transparency.

As has been shown, the invention is greatly beneficial to the industry.

The invention may be embodied in other specific forms without departing from the spirit or essential characteristics thereof. The present embodiment is to be considered in all respects as illustrative and not restrictive, the scope of the invention being indicated by the appended claims rather than by the foregoing description and all changes which come within the meaning and range of equivalency of the claims are intended to be embraced therein.

What is claimed is:

1. A method of forming a chemically adsorbed monomolecular film on the surface of a substrate, wherein the surface of the substrate contains active hydrogen groups, the method comprising:
   (A) preparing a chemical adsorbing material solution by dissolving a chemical adsorbing material in a non-aqueous organic solvent, said chemical adsorbing material having end functional molecular groups capable of reacting with the active hydrogen groups on the substrate surface;
   (B) dipping the substrate in said chemical adsorbing material solution and applying ultrasonic waves, thereby causing adsorption of the chemical adsorbing material to the substrate surface; and
   (C) washing non-reacted chemical adsorbing material away from the substrate surface using a non-aqueous organic solution.

2. The method of manufacturing a chemically adsorbed monomolecular film according to claim 1, wherein an ultrasonic waves are applied to said organic solution during the step of washing away said non-reacted chemically adsorbing material.

3. The method of manufacturing a chemically adsorbed monomolecular film according to claim 1 or 2, wherein the frequency of said ultrasonic waves are in a range of 1 to 1,000 kHz.

4. The method of manufacturing a chemically adsorbed monomolecular film according to claim 1, wherein said molecular groups of said chemical adsorbing material comprise at least one member selected from the group consisting of a halogenated silyl (—SiX) group, a halogenated titanyl (—TiX) group, a halogenated stannyl (—SnX) group, a lower-alkoxysilyl (—SiOR) group, a lower-alkoxytitanyl (—TiOR) group and a lower-alkoxystannyl (—SnOR) group, where X represents chlorine, bromine, fluorine or iodine and R represents a $C_1$-$C_6$ alkly group.

5. The method of manufacturing a chemically adsorbed monomolecular film according to claim 1, wherein said chemical adsorbing material comprises an end functional chlorosilyl (—SiCl) group and a fluorine group.

6. The method of manufacturing a chemically adsorbed monomolecular film according to claim 1, wherein the concentration of said chemical adsorbing material in said non-aqueous organic solvent is in a range of $10^{-4}$ to $10^{-1}$ mol/l.

7. The method of manufacturing a chemically adsorbed monomolecular film according to claim 1, wherein the substrate comprises material selected from the group consisting of glass, metals, ceramics, plastics and semiconductors.

8. The method of manufacturing a chemically adsorbed monomolecular film according to claim 1, wherein the substrate is an oxidation treated plastic substrate.

9. A method of forming a chemically adsorbed polymer film on the surface of a substrate, wherein the surface of the substrate contains active hydrogen groups, the method comprising:
 (a) preparing a chemical adsorbing material solution by dissolving a chemical adsorbing material in a non-aqueous organic solvent, said chemical adsorbing material having end functional molecular groups capable of reacting with the active hydrogen groups on the substrate surface;
 (b) dipping the substrate in said chemical adsorbing material solution and applying ultrasonic waves, thereby causing adsorption of the chemical adsorbing material to the substrate surface;
 (c) forming on the substrate adsorbed precursor film constituted by a compound containing a silanol group by reacting the chlorosilane groups with water after the dipping step; and
 (d) drying said adsorbed precursor film.

10. The method of manufacturing a chemically adsorbed polymer film according to claim 9, wherein the frequency of said ultrasonic waves are in a range of 1 to 1,000 kHz.

11. The method of manufacturing a chemically adsorbed polymer film according to claim 9, wherein said molecular groups of said chemical adsorbing material comprise at least one member selected from the group consisting of a halogenated silyl (—SiX) group, a halogenated titanyl (—TiX) group, a halogenated stannyl (—SnX) group, a lower-alkoxysilyl (—SiOR) group, a lower-alkoxytitanyl (—TiOR) group and a lower-alkoxystannyl (—SnOR) group, where X represents chlorine, bromine, fluorine or iodine and R represents a $C_1$-$C_6$ alkyl group.

12. The method of manufacturing a chemically adsorbed polymer film according to claim 9, wherein said chemical adsorbing material comprises an end functional chlorosilyl (—SiCl) group and a fluorine group.

13. The method of manufacturing a chemically adsorbed polymer film according to claim 9, wherein the concentration of said chemical adsorbing material in said non-aqueous organic solvent is in a range of $10^{-4}$ to $10^{-1}$ mol/l.

14. The method of manufacturing a chemically adsorbed polymer film according to claim 9, wherein the substrate comprises material selected from the group consisting of glass, metals, ceramics, plastics and semiconductors.

15. The method of manufacturing a chemically adsorbed polymer film according to claim 9, wherein the substrate is an oxidation treated plastic substrate.

* * * * *